(12) United States Patent
Kim et al.

(10) Patent No.: US 8,174,471 B2
(45) Date of Patent: May 8, 2012

(54) ARRAY SUBSTRATE FOR LIQUID CRYSTAL DISPLAY DEVICE

(75) Inventors: Hyun-Chul Kim, Yeosu-si (KR); Jin-Cheol Hong, Gumi-si (KR)

(73) Assignee: LG Display Co. Ltd., Seoul (KR)

( * ) Notice: Subject to any disclaimer, the term of this patent is extended or adjusted under 35 U.S.C. 154(b) by 706 days.

(21) Appl. No.: 12/330,720

(22) Filed: Dec. 9, 2008

(65) Prior Publication Data

US 2009/0167654 A1 Jul. 2, 2009

(30) Foreign Application Priority Data

Dec. 31, 2007 (KR) .................. 10-2007-0141816

(51) Int. Cl.
*G09G 3/36* (2006.01)
(52) U.S. Cl. ......................... 345/87; 345/80; 349/143
(58) Field of Classification Search .............. 345/80, 345/87, 92; 349/149–152, 143
See application file for complete search history.

(56) References Cited

U.S. PATENT DOCUMENTS

| | | | |
|---|---|---|---|
| 5,870,163 A * | 2/1999 | Watanabe et al. ............. | 349/149 |
| 2006/0256272 A1 * | 11/2006 | Liou et al. ..................... | 349/149 |
| 2007/0216845 A1 * | 9/2007 | Liao et al. ..................... | 349/149 |

FOREIGN PATENT DOCUMENTS

JP 8-76136 3/1996

OTHER PUBLICATIONS

Office Action issued in corresponding Japanese Patent Application No. 2008-257057, mailed Aug. 16, 2011.

* cited by examiner

*Primary Examiner* — Hoa T Nguyen
*Assistant Examiner* — Andrew Sasinowski
(74) *Attorney, Agent, or Firm* — Brinks Hofer Gilson & Lione

(57) ABSTRACT

An array substrate for a liquid crystal display device includes a substrate including a display area and a non-display area, the non-display area having a link area and a pad area, array elements in the display area on the substrate, first to nth pads in the pad area (n is a natural number), first to nth link lines in the link area and connected to the first to nth pads, respectively, wherein the first to (n/2−1)th link lines are symmetrical with the nth to (n/2+1)th link lines with respect to (n/2)th link line, the first to (n/2−1)th link lines have inclined portions, and the inclined portions of the first to kth link lines have decreasing widths and decreasing lengths toward the kth link line from the first link line, wherein k is larger than 1 and smaller than (n/2).

15 Claims, 7 Drawing Sheets

| a | b | $(R_1/R_2)*100$ | Efficiency (%) |
|---|---|---|---|
| 100 | 119 | 83.9 | 16.1 |
| 200 | 163 | 78.9 | 21.1 |
| 300 | 196 | 75.7 | 24.3 |
| 400 | 224 | 73.4 | 26.6 |
| 500 | 247 | 71.5 | 28.5 |
| 600 | 268 | 70.0 | 30.0 |
| 700 | 287 | 68.7 | 31.3 |
| 800 | 304 | 67.5 | 32.5 |
| 900 | 321 | 66.7 | 33.3 |
| 1000 | 336 | 65.8 | 34.2 |
| 1100 | 350 | 65.0 | 35.0 |
| 1200 | 364 | 64.4 | 35.6 |
| 1300 | 377 | 63.8 | 36.2 |
| 1400 | 390 | 63.3 | 36.7 |

FIG. 10

ARRAY SUBSTRATE FOR LIQUID CRYSTAL DISPLAY DEVICE

RELATED APPLICATIONS

The invention claims the benefit of Korean Patent Application No. 2007-0141816 filed in Korea on Dec. 31, 2007, which is hereby incorporated by reference for all purposes as if fully set forth herein.

BACKGROUND

1. Field of the Invention

The invention relates to a liquid crystal display device, and more particularly, to an array substrate for a liquid crystal display device.

2. Discussion of the Related Art

In general, among flat panel display (FPD) devices, liquid crystal display (LCD) devices have been in the spotlight as the next generation display devices for cellular phones, personal computer monitors or televisions because of their superior visibility, low power consumption and low generation of heat.

Liquid crystal display (LCD) devices use the optical anisotropy and polarization properties of liquid crystal molecules of a liquid crystal layer to produce an image. The liquid crystal molecules have long, thin shapes, and the liquid crystal molecules can be arranged along a certain direction. The alignment direction of the liquid crystal molecules can be controlled by varying the intensity of an electric field applied to the liquid crystal layer. Accordingly, the alignment of the liquid crystal molecules are changed by the electric field. Light is transmitted and refracted according to the alignment of the liquid crystal molecules to display an image.

A related art liquid crystal display device will be explained with reference to the accompanying drawings.

FIG. 1 is a plan view, schematically illustrating an array substrate for a liquid crystal display (LCD) device according to the related art.

In FIG. 1, an array substrate of a related art LCD device includes a display area AA and a non-display area NAA. Images are displayed in the display area AA.

First to mth gate lines GL1 to GLm and first to nth data lines DL1 to DLn are formed in the display area AA on a substrate 10 and are arranged in a matrix form. The first to mth gate lines GL1 to GLm and the first to nth data lines DL1 to DLn cross each other to define pixel regions P. The first to mth gate lines GL1 to GLm receive scanning signals, and the first to nth data lines DL1 to DLn receive data signals.

A thin film transistor T is formed at each crossing point of the first to mth gate lines GL1 to GLm and the first to nth data lines DL1 to DLn. A pixel electrode 80 is formed in each pixel region P and is connected to the thin film transistor T.

The first to mth gate lines GL1 to GLm are electrically connected with first to mth gate pads GP1 to GPm through first to mth gate link lines GLL1 to GLLm, respectively. The first to nth data lines DL1 to DLn are electrically connected with first to nth data pads DP1 to DPn through first to nth data link lines DLL1 to DLLn, respectively.

The first to mth gate pads GP1 to GPm are partially exposed by first to mth gate pad contact holes (not shown) and are connected to first to mth gate pad terminals (not shown), which are formed on the same layer and of the same material as the pixel electrodes 80, through the first to mth gate pad contact holes (not shown), respectively. The first to nth data pads DP1 to DPn are partially exposed by first to nth data pad contact holes (not shown) and are connected to first to nth data pad terminals (not shown), which are formed on the same layer and of the same material as the pixel electrodes 80, through the first to nth data pad contact holes (not shown), respectively.

The first to mth gate pad terminals (not shown) and the first to nth data pad terminals (not shown) are connected to gate and data driving integrated circuits (ICs) (not shown), which are attached at respective sides of the substrate 10 by a tape automated bonding (TAB) packaging process. The first to mth gate pad terminals supply the first to mth gate lines GL1 to GLm with the scanning signals from the gate driving integrated circuit. The first to nth data pad terminals provide the first to nth data lines DL1 to DLn with the data signals from the data driving integrated circuit.

FIG. 2 is an enlarged view of a region A of FIG. 1, and FIG. 3 is an enlarged view of a left half part of the region A of FIG. 2. FIG. 2 and FIG. 3 illustrate the non-display area NAA on the substrate 10 including the display area AA of FIG. 1 and the non-display area NAA, and in particular, a data pad area PA.

In FIG. 2 and FIG. 3, the first to nth data pads DP1 to DPn are formed in the data pad area PA. The first to nth data pads DP1 to DPn are spaced apart from each other with a pad pitch P1 therebetween. The first to nth data link lines DLL1 to DLLn are connected to the first to nth data pads DP1 to DPn, respectively. The first to nth data link lines DLL1 to DLLn provide signals to the first to nth data lines DL1 to DLn of FIG. 1.

The first to nth data link lines DLL1 to DLLn include vertical portions, which are connected to the first to nth data pads DP1 to DPn, and inclined portions, which aslant and extend from the vertical portions. The first to nth data link lines DLL1 to DLLn have the same width W, and link pitches P2 between adjacent data link lines including the width of one of the adjacent data link lines are designed at regular intervals regardless of the vertical portions and the inclined portions. Accordingly, link spaces F2 between facing side surfaces of adjacent data link lines are the differences between the link pitches P2 and the widths W.

In the above-mentioned structure, the lengths of the data link lines become longer toward the first data link line DLL1 from the (n/2−1)th data link line DLL(n/2−1) and toward the nth data link line DLLn from the (n/2+1)th data link line DLL(n/2+1) based on the (n/2)th data link line DLL(n/2).

Generally, electrical resistance is proportional to a length and reciprocal proportional to a cross sectional area. That is, as a signal line gets longer, the electrical resistance of the signal line becomes higher because electrons pass through a longer path. Since the first to nth data link lines DLL1 to DLLn have the same width W, the resistances of the data link lines get higher as the data link lines become farther from the (n/2)th data link line and go to left and right peripheral regions.

Recently, research has been conducted to decrease the number of driver ICs and reduce manufacturing costs. However, as the size of LC panels increases, the number of the data link lines increases, and the lengths of the data link lines in the left and right peripheral regions become much longer.

Moreover, in LCD devices having high resolution, while the data link lines increase, the link pitches between adjacent data link lines decrease. This causes the data link lines in the left and right peripheral regions have much higher electrical resistance than the data link lines in the central region between the left and right peripheral regions, and there occur uncharged problems.

BRIEF SUMMARY

An array substrate for a display device includes a substrate including a display area and a non-display area, the non-display area having a link area and a pad area, array elements in the display area on the substrate, first to nth pads in the pad area (n is a natural number), first to nth link lines in the link area and connected the array elements to the first to nth pads, respectively, wherein the first to (n/2−1)th link lines have inclined portions, the width of the inclined portion of the pth link line is wider than the width of the inclined portion of the qth link line, the length of the inclined portion of the pth link line is longer than the length of the inclined portion of the qth link line, the k, p and q are natural numbers, and (n/2−1) ≧k≧q>p≧1.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 10 is a table illustrating ratios of the resistances and efficiencies according to the values of the points "a" and "b."

DETAILED DESCRIPTION OF THE DRAWINGS AND THE PRESENTLY PREFERRED EMBODIMENTS

Reference will now be made in detail to embodiments of the present invention, examples of which are illustrated in the accompanying drawings.

In the present embodiment of the invention, gate and data link lines in gate and data link areas have different widths to obtain a uniform resistance in the link areas.

Figure 4:
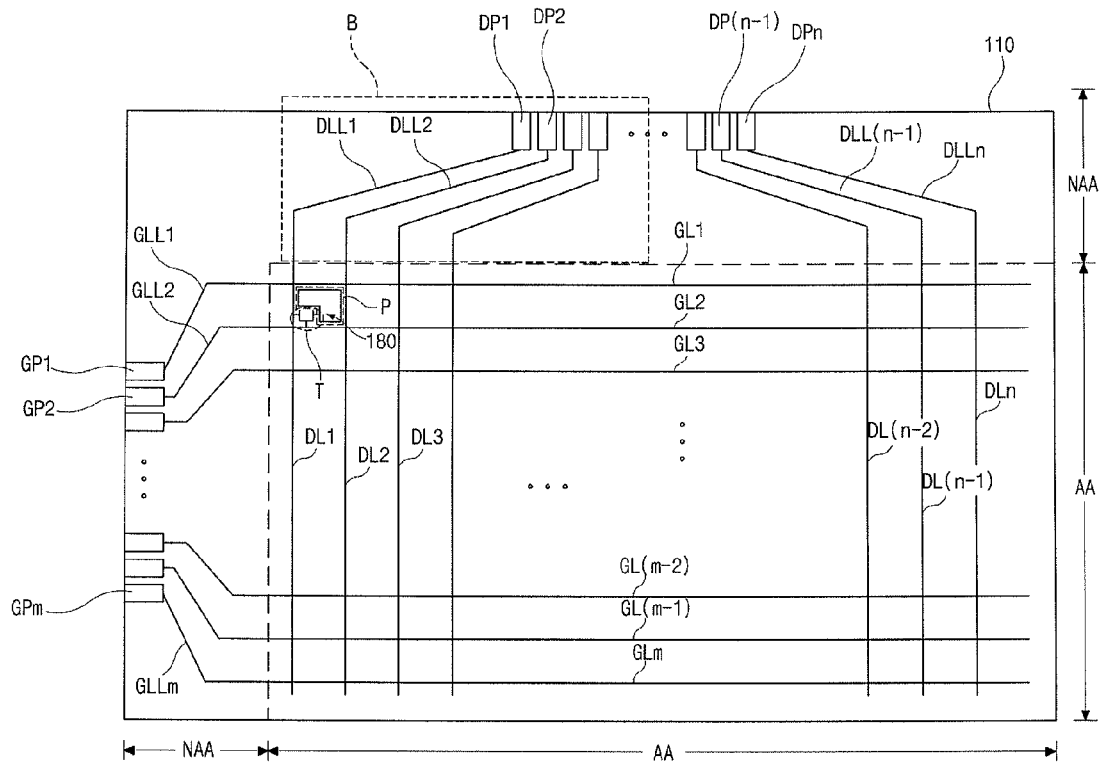
FIG. 4 is a plan view schematically illustrating an array substrate for a liquid crystal display device according to an exemplary embodiment of the present invention.

FIG. 4 is a plan view of schematically illustrating an array substrate for a liquid crystal display (LCD) device according to an exemplary embodiment of the present invention.

In FIG. 4, an array substrate of an LCD device according to an embodiment of the present invention includes a display area AA and a non-display area NAA. Images are displayed in the display area AA.

First to mth gate lines GL1 to GLm and first to nth data lines DL1 to DLn are formed in the display area AA on a substrate 110 and are arranged in a matrix form, wherein m and n are natural numbers. The first to mth gate lines GL1 to GLm and the first to nth data lines DL1 to DLn cross each other to define pixel regions P. The first to mth gate lines GL1 to GLm receive scanning signals, and the first to nth data lines DL1 to DLn receive data signals.

A thin film transistor T is formed at each crossing point of the first to mth gate lines GL1 to GLm and the first to nth data lines DL1 to DLn. A pixel electrode 180 is formed in each pixel region P and is connected to the thin film transistor T.

The electrodes and lines in the display area AA may be referred to as an array element.

The first to mth gate lines GL1 to GLm are electrically connected with first to mth gate pads GP1 to GPm through first to mth gate link lines GLL1 to GLLm, respectively. The first to nth data lines DL1 to DLn are electrically connected with first to nth data pads DP1 to DPn through first to nth data link lines DLL1 to DLLn, respectively.

The first to mth gate pads GP1 to GPm are partially exposed by first to mth gate pad contact holes (not shown) and are connected to first to mth gate pad terminals (not shown) through the first to mth gate pad contact holes (not shown), respectively. The first to nth data pads DP1 to DPn are partially exposed by first to nth data pad contact holes (not shown) and are connected to first to nth data pad terminals (not shown) through the first to nth data pad contact holes (not shown), respectively. The first to mth gate pad terminals and the first to nth data pad terminals are formed on the same layer and of the same material as the pixel electrodes 180.

The first to mth gate pad terminals (not shown) and the first to nth data pad terminals (not shown) are connected to gate and data driving integrated circuits (ICs) (not shown), which are attached at respective sides of the substrate 110 by a tape automated bonding (TAB) packaging process. The first to mth gate pad terminals supply the first to mth gate lines GL1 to GLm with the scanning signals from the gate driving integrated circuit. The first to nth data pad terminals provide the first to nth data lines DL1 to DLn with the data signals from the data driving integrated circuit.

The first to mth gate link lines GLL1 to GLLm and the first to nth data link lines DLL1 to DLLn have different widths. Hereinafter, a more detail explanation will be made with reference to accompanying drawings.

Figure 5:
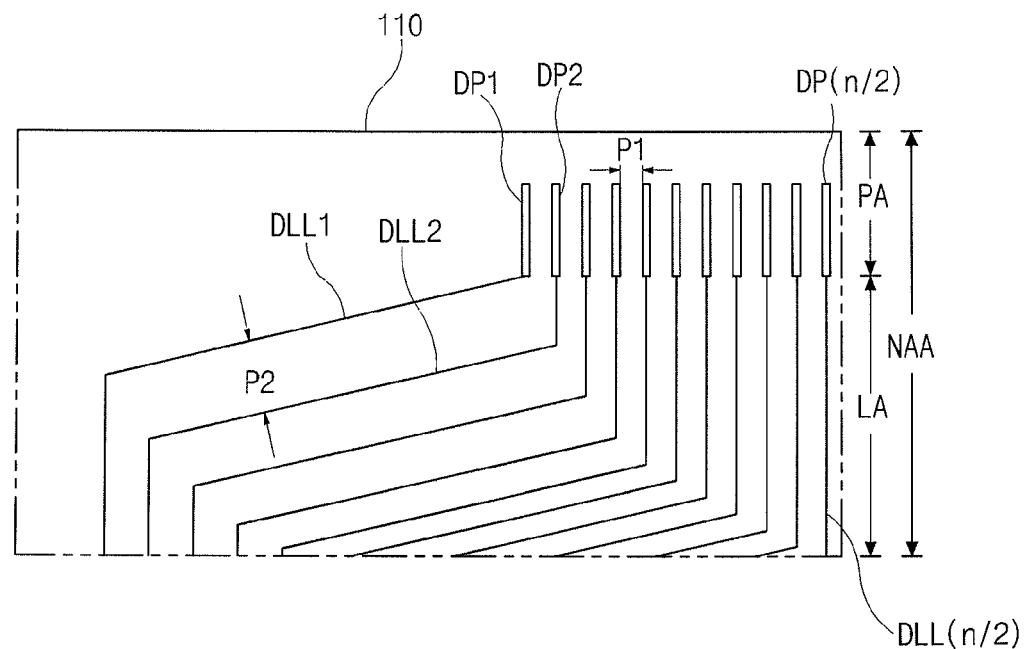
FIG. 5 is an enlarged view of a region B of FIG. 4.

FIG. 5 is an enlarged view of a region B of FIG. 4. FIG. 5 shows a left half part of the non-display area corresponding to the data link lines and the data pads of FIG. 4 because the data link lines have a symmetrical structure with respect to the (n/2)th data link line.

In FIG. 5, the non-display area NAA on the substrate 110 are divided into a link area LA and a pad area PA. In the pad area PA on the substrate 110, the first to (n/2)th data pads DP1 to DP(n/2) are spaced apart from each other with the same pad pitch P1. The first to (n/2)th data link lines DLL1 to DLL(n/2) corresponding to the first to (n/2)th data pads DP1 to DP(n/2) are connected to the first to (n/2)th data lines DL1 to DL(n/2) of FIG. 4, respectively.

The first data link line DLL1 has a bent portion and is symmetrical to the nth data link line DLLn of FIG. 4 with respect to the (n/2)th data link line DLL(n/2), which is straight without a bent portion. In addition, the second to (n/2−1)th data link lines DLL2 to DLL(n/2−1) have at least one bent portion, that is, one or two bent portions. Each of the first to (n/2−1)th data link lines DLL1 to DLL(n/2−1) includes an inclined portion. Link pitches P2 between the inclined portions of adjacent data link lines decrease toward the (n/2)th data link line DLL(n/2) from the first data link line DLL1. Similarly, although not shown in the figure, the (n/2+1)th to (n−1)th data link lines DLL(n/2+1) to DLL(n−1) of FIG. 4 have at least one bent portion, and link pitches between inclined portions of adjacent data link lines decrease toward the (n/2+1)th data link line DLL(n/2+1) from the nth data link line DLLn of FIG. 4. Each link pitch may be defined as a distance from a center of one data link line to a center of a next data link line. Alternatively, the link pitch may be defined as a distance from a side of one data link line to a side of a next data link line across either the one data line or the next data link line.

The first data link line DLL1 may have two bent portions, and several data link lines near the (n/2)th data link line DLL(n/2) may be straight without a bent portion.

Figure 1:
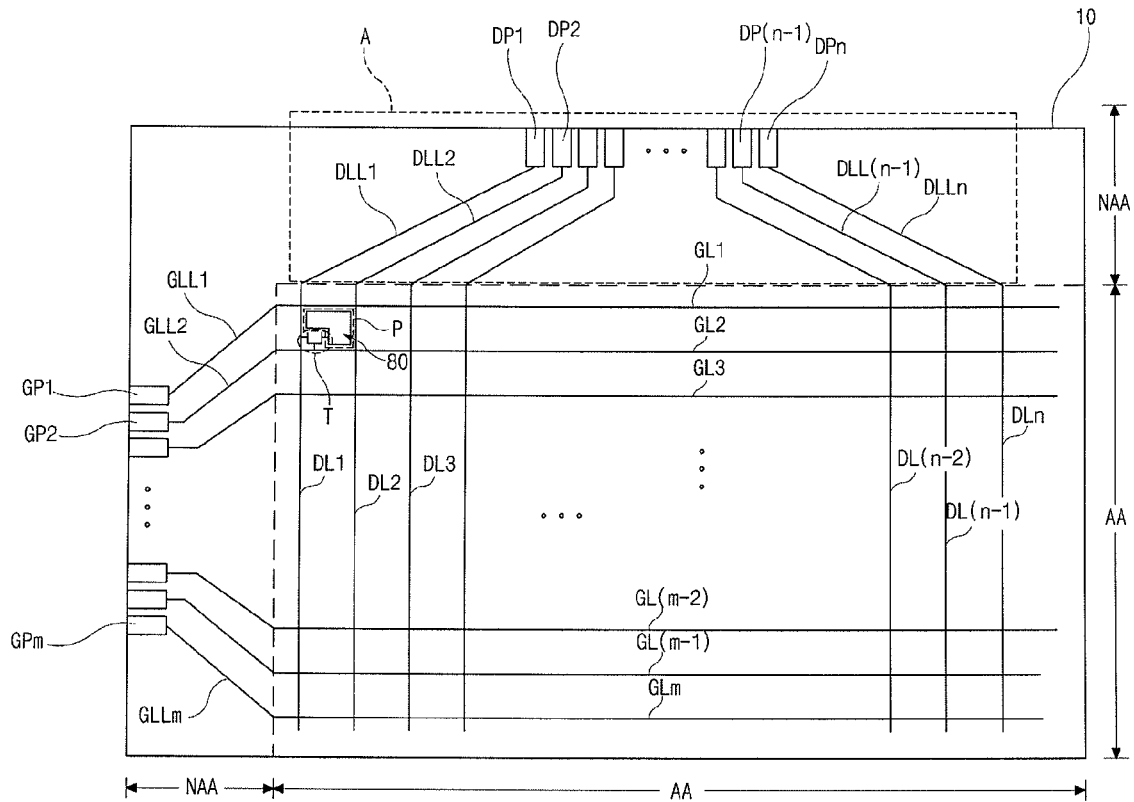
FIG. 1 is a plan view schematically illustrating an array substrate for a liquid crystal display device according to the related art.
Figure 2:
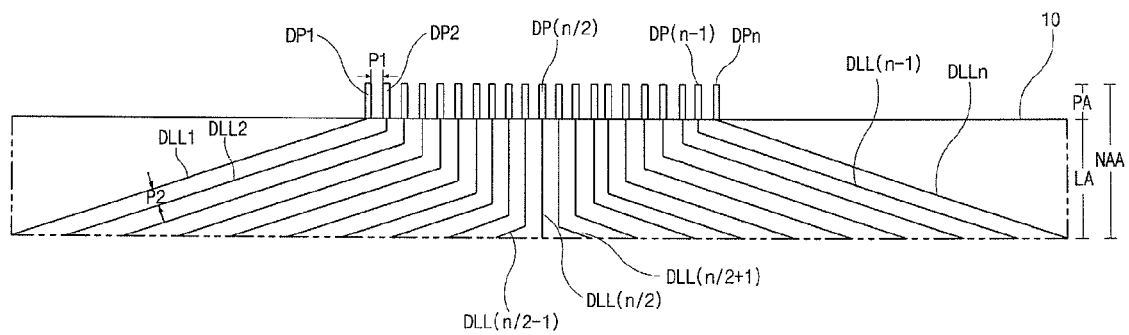
FIG. 2 is an enlarged view of a region A of FIG. 1.

More particularly, the link pitches P2 in a central region of the link area LA near by the (n/2)th data link line DLL(n/2) are smaller than the link pitches of FIG. 2, and the width of the link lines in the central region of the link area LA near by the (n/2)th data link line DLL(n/2) is equal to the width of the link line of FIG. 2. Therefore, resistances of the data link lines increase in the central region of the link area LA as compared with the related art. In the embodiments of the present disclosure, even though the data link lines in the peripheral region get longer, the data link lines in the peripheral region can have wider widths due to enough link pitches. That is, the width of the inclined portion of the pth link line is wider than the width of the inclined portion of the qth link line and the length of the inclined portion of the pth link line is longer than the length of the inclined portion of the qth link line, wherein the k, p and q are natural numbers and (n/2−1)≧k≧q>p≧1. In this embodiment, The link pitches P2 in a peripheral region of the link area LA near by the first data link DLL1 gradually increase toward the first data link line DLL1 and the width of the link lines in the peripheral region of the link area LA near by the first data link line DLL1 gradually increase toward the first data link line DLL1. Therefore, resistances of the data link lines decrease in the peripheral region of the link area LA. Accordingly, the resistances may be uniform in the central region and the peripheral region of the link area LA.

In the present invention, even though the data link lines in the peripheral region get longer, the data link lines in the peripheral region can have wider widths due to enough link pitches.

Figure 6:
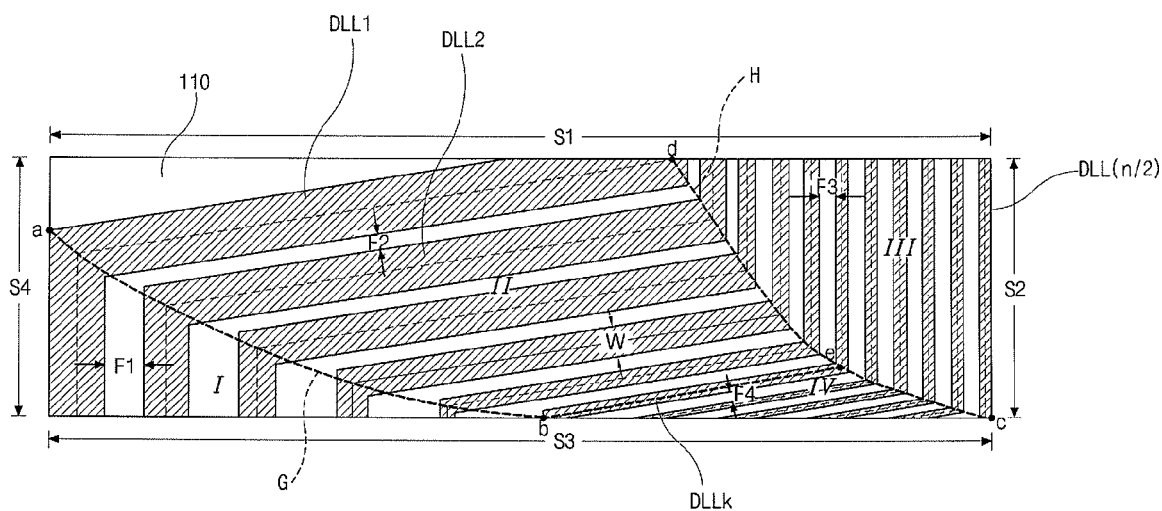
FIG. 6 is an enlarged plan view illustrating the link area of FIG. 5 in detail.

FIG. 6 is an enlarged plan view of illustrating the link area of FIG. 5 in detail.

In FIG. 6, a rectangle is defined to surround the first to (n/2)th data link lines DLL1 to DLL(n/2). The rectangle includes first, second, third and fourth sides S1, S2, S3 and S4. Points "a," "b," "c" and "d" are determined on the four sides of the rectangle. The point "a" is disposed on the fourth side S4 corresponding to the first data link line DLL1. The point "b" is disposed on the third side S3 corresponding to a border between the link area LA of FIG. 5 and the display area M of FIG. 4. The point "c" is disposed a vertex at which the second side S2 corresponding to the (n/2)th data link line DLL(n/2) meets the third side S3. The point "d" is disposed on the first side S1 corresponding to the first to (n/2)th data link pads DP1 to DP(n/2).

Any data link line corresponding to the point "b" may be defined as a kth data link line DLLk, wherein k is a natural number larger than 1 and smaller than n/2. A point of contact "e" can be determined at which the kth data link line DLLk corresponding to the point "b" contacts a dotted line H connecting the point "c" and the point "d." Accordingly, first, second, third and fourth regions I, II, III and IV are defined by the points "a," "b," "c," "d" and "e." That is, the first region I is defined by the third side S3, the fourth side S4 and the points "a" and "b." The second region II is defined by the first side S1, the fourth side S4, and the points "a," "b," "d" and "e." The third region III is defined by the first side S1, the second side S2, and the points "c," "d" and "e." The fourth region IV is defined by the third side S3 and the points "b," "c" and "e."

The first to (k−1)th data link lines DLL1 to DLL(k−1) includes first vertical portions, inclined portions and second vertical portions. The first vertical portions extend from the first to (k−1)th data pads DP1 to DP(k−1) of FIG. 5 along a vertical direction in the context of the figure. The inclined portions aslant and extend from the first vertical portions in parallel with each other. The second vertical portions extend from the inclined portions and are parallel to the first vertical portions. As shown in FIG. 6, the first data link line DLL1 may include only the inclined portion and the second vertical portion without the first vertical portion.

The point "a" may be a point of contact at which an edge of the inclined portion of the first data link line DLL1 meets an edge of the second vertical portion of the first data link line DLL1. A position of the point "a" may be changed according to the design of the first data link line DLL1 and will be explained later.

The first vertical portions of the first to (k−1)th data link lines DLL1 to DLL(k−1) are disposed in the third region III, the inclined portions are disposed in the second region II, and the second vertical portions are disposed in the first region I.

The second vertical portions of the first to (k−1)th data link lines DLL1 to DLL(k−1) have decreasing lengths toward the (k−1)th data link line DLL(k−1) from the first data link line DLL1, and widths of the second vertical portions of the first to (k−1)th data link lines DLL1 to DLL(k−1) decrease toward the (k−1)th data link line DLL(k−1) from the first data link line DLL1. Alternatively, the widths of the second vertical portions of the first to (k−1)th data link lines DLL1 to DLL(k−1) may be the same. A dotted line G is defined, which connects ends of the second vertical portions of the first to (k−1)th data link lines DLL1 to DLL(k−1) far from the first to (k−1)th data lines DL1 to DL(k−1) of FIG. 4 and corresponds to a line connecting the points "a" and "b." The dotted line G is curved.

In the embodiments of present invention disclosed herein, the inclined portions of the first to (k−1)th data link lines DLL1 to DLL(k−1) have increasing widths W toward the first data link line DLL1 from the (k−1)th data link line DLL(k−1).

In FIG. 5, the widths of the first to (k−1)th data lines are not considered, and the link pitches P2 between inclined portions of adjacent data link lines are explained to gradually increase toward the first data link line DLL1. However, in an actual design as shown in FIG. 6, since the widths W of the inclined portions of the first to (k−1)th data link lines DLL1 to DLL(k−1) are designed differently, link spaces F2 between adjacent inclined portions of the first to (k−1)th data link lines DLL1 to DLL(k−1), beneficially, may be the same in the second region II. The link spaces F2 may be defined by a distance between facing side surfaces of the inclined portions of adjacent data link line. On the other hand, the link spaces F2 between adjacent inclined portions of the first to (k−1)th data link lines DLL1 to DLL(k−1) may be different from one another.

The first link spaces F1 between adjacent second vertical portions of the first to (k−1)th data link lines DLL1 to DLL(k−1) may be larger than second link spaces, that is, the link spaces F2 between adjacent inclined portions of the first to (k−1)th data link lines DLL1 to DLL(k−1). The first link spaces F2 between adjacent second vertical portions of the first to (k−1)th data link lines DLL1 to DLL(k−1) may be different from one another.

The kth to (n/2−1)th data link lines DLLk to DLL(n/2−1) between the points "b" and "c" include first vertical portions and inclined portions. The first vertical portions of the kth to (n/2−1)th data link lines DLLk to DLL(n/2−1) extend from the kth to (n/2−1)th data pads DPk to DP(n/2−1) along a vertical direction in the context of the figure. The inclined portions of the kth to (n/2−1)th data link lines DLLk to DLL(n/2−1) aslant and extend from the first vertical portions of the kth to (n/2−1)th data link lines DLLk to DLL(n/2−1) in parallel with each other. The first vertical portions of the kth to (n/2−1)th data link lines DLLk to DLL(n/2−1) are disposed in the third region III. The inclined portions of the kth to (n/2−1)th data link lines DLLk to DLL(n/2−1) are disposed in the fourth region IV.

The first vertical portions of the first to (k−1)th data link lines DLL1 to DLL(k−1) and the first vertical portions of the kth to (n/2−1)th data link lines DLLk to DLL(n/2−1) have increasing lengths toward the (n/2)th data link line DLL(n/2) from the first data link line DLL1. The first vertical portions of the first to (n/2−1)th data link lines DLL1 to DLL(n/2−1) have different widths. Third link spaces F3 between adjacent first vertical portions of the first to (n/2)th data link lines DLL1 to DLL(n/2) may be different from one another. Beneficially, the link pitches between adjacent first vertical portions of the first to (n/2)th data link lines DLL1 to DLL(n/2), which is determined by the sum of a link width and a corresponding link space, may be equal to each other. Alternatively, the first vertical portions of the first to (n/2−1)th data link lines DLL1 to DLL(n/2−1) may have the same width, and the third link spaces F3 may be equal to each other.

The third link spaces F3 between adjacent first vertical portions of the first to (n/2−1)th data link lines DLL1 to DLL(n/2−1) may be narrower than the first and second link spaces F1 and F2. In some cases, the third link spaces F3 can be wider than the first and second link spaces F1 and F2.

Here, the dotted line H connecting the point "c" and the point "d," that is, connecting ends of the first vertical portions of the first to (n/2−1)th data link lines DLL1 to DLL(n/2−1) far from the first to (n/2−1)th data pads DP1 to DP(n/2−1) of FIG. 5, has a steeper slope than the dotted line G.

Figure 3:
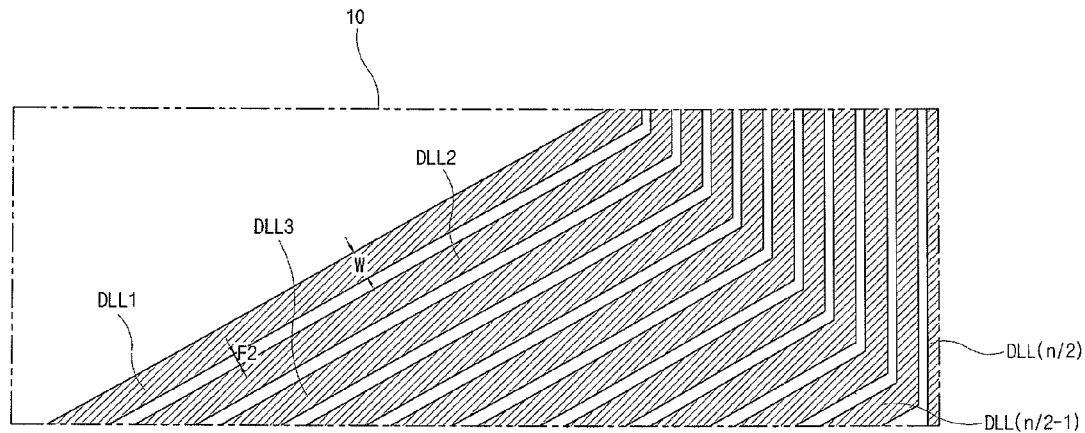
FIG. 3 is an enlarged view of a left half part of the region A of FIG. 2.

The inclined portions of the kth to (n/2−1) data link lines DLLk to DLL(n/2−1) may have the same width, and fourth link spaces F4 between adjacent inclined portions of the kth to (n/2−1) data link lines DLLk to DLL(n/2−1) may be equal to each other. Otherwise, the inclined portions of the kth to (n/2−1) data link lines DLLk to DLL(n/2−1) may have different widths, and the fourth link spaces F4 may be different from each other. Link pitches, each of which is the sum of the fourth link space F4 and the width of each inclined portion of the kth to (n/2−1) data link lines DLLk to DLL(n/2−1), may be the same and may be narrower than the link pitches P2 of FIG. 3 of the related art.

In the present disclosure, the link pitches in the fourth region IV are smaller than the link pitches of the related art, and the data link lines in the fourth region IV have narrow widths as compared with the related art. Accordingly, the data link lines in the central region of the link area LA of FIG. 5 have increased resistances as compared with the related art. In addition, since the data link lines in the first and second regions I and 11 have increasing widths, the date link lines in the peripheral regions of the link area LA of FIG. 5 have decreased resistances as compared with the related art. As a result, uniform resistances are attained in the link area LA of FIG. 5.

Accordingly, resistance differences are uniform in the central region, where the kth to (n/2)th data link lines DLLk to DLL(n/2) are disposed, and in the peripheral region, where the first to (k−1)th data link lines DLL1 to DLL(k−1) are disposed, and the uncharged problems can be solved.

Here, it is important to determine the point "a" on the fourth side S4 and the point "b" on the third side S3. This will be described hereinafter in detail with reference to accompanying drawings.

Figure 7A:
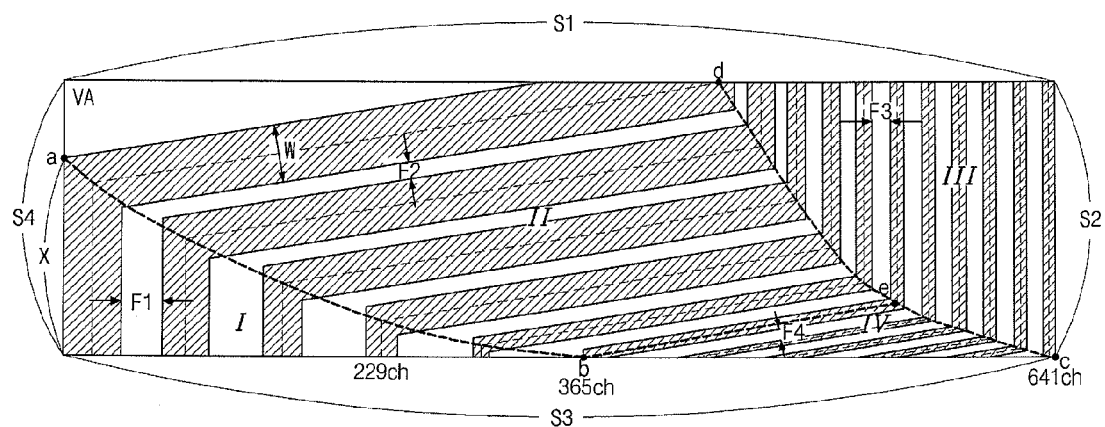
FIG. 7A is a plan view illustrating design values of the link area according to the present invention.
Figure 7B:
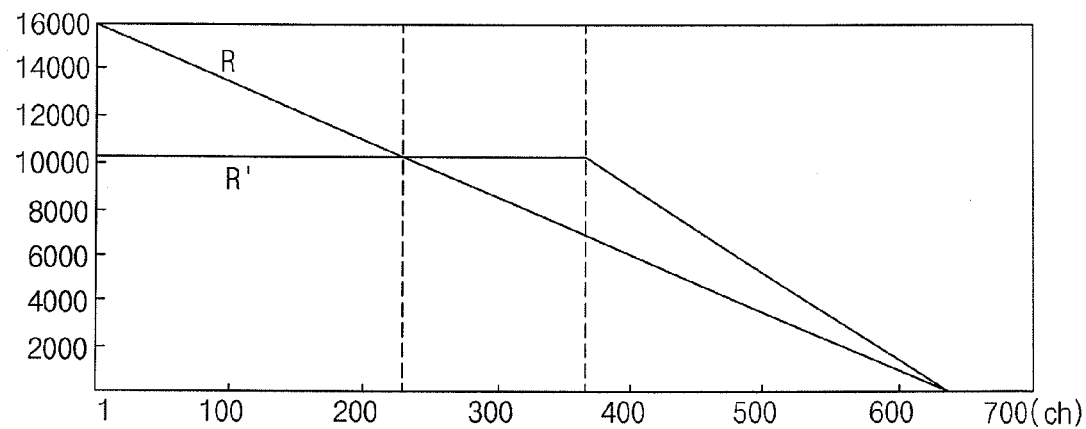
FIG. 7B is a graph illustrating resistances of data link lines according to the present invention and the related art.
Figure 7C:
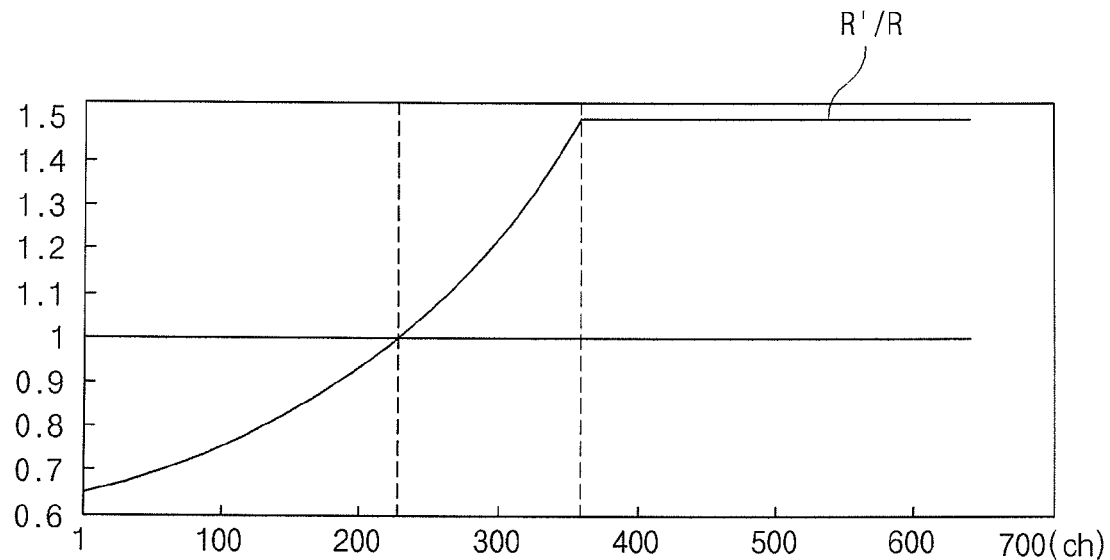
FIG. 7C is a graph illustrating ratios of the resistances of the data link lines according to the present invention over the resistances of the data link lines according to the related art.

FIG. 7A is a plan view of illustrating design values of the link area according to an embodiment of the present invention, FIG. 7B is a graph of illustrating resistances of data link lines according to the embodiment of the present invention and the related art, and FIG. 7C is a graph of illustrating ratios of the resistances of the data link lines according to the present invention over the resistances of the data link lines according to the related art.

For example, a driver IC including 1281 channels maximum may be considered. At this time, FIG. 7A shows a left half part of a link area corresponding to first to 641st channels, more particularly, illustrates first to 641st data link lines, even though all the first to 641st data link lines are not presented. In FIGS. 7B and 7C, R is the resistances of the first to 641st data link lines of the related art, and R' is the resistances of the first to 641 st data link lines of the present invention.

As shown in FIGS. 7A, 7B and 7C, the rectangle is defined to surround the first to 641 st data link lines. The rectangle has the first, second, third and fourth sides S1, S2, S3 and S4 and includes the first, second, third and fourth regions I, II, III and IV. A length X is defined as a distance from a point "a" on the fourth side S4 to a point of contact at which the third and fourth sides S3 and S4 meet each other.

Here, the first, second, third and fourth link spaces F1, F2, F3 and F4 are defined as a distance between two facing side surfaces of adjacent link lines in the first, second, third and fourth regions I, II, III and IV, respectively. A link pitch is defined by the sum of a link width and the link space.

When the length X increases by moving the point "a" upward in the context of the figure, the link pitches may increase more in the second region II. Thus, the widths W of the data link lines in the second region II can increase more, and the resistances in the peripheral region of the link area LA of FIG. 5 can be more decreased. However, in this case, the link pitches in the fourth region IV are also decreased, and there may be an electrical short between adjacent data link lines in the fourth region IV. Accordingly, it is not easy to increase the length X without limit. Especially, in an area VA above the inclined portion of the first data link line in the second region II, a LOG (Line on Glass) line (not shown) for applying gate driving signals is disposed, and thus increasing the length X by moving the point "a" is limited.

Like this, it is the most important to determine the length X and the point "a." Here, a position of the point "b" is changed according to the length X and may be determined when the length X is within a range of 1 to 4,800 micrometers. Desirably, the most effect can be had when the second and fourth sides S2 and S4 may be 4,800 micrometers, the length X is 1,200 micrometers, and the point "b" corresponds to the 365th data link line.

Accordingly, the resistances R' of FIGS. 7B and 7C are obtained when the data link lines are designed such that the second side S2 is 4,800 micrometers, the length X is 1,200 micrometers, and the point "b" corresponds to the 365th data link line.

In the related art, the resistances R of the first to 641st data link lines linearly decrease toward the 641st data link line from the first data link line. That is, the first data link line has the largest resistance, and the 641st data link line has the smallest resistance. Therefore, the resistances in the peripheral region are considerably larger than the resistances in the central region.

On the other hand, in the embodiment of the present invention, the resistances R' are substantially uniform from the first data link line toward the 365th data link line and gradually decrease from the 365th data link line toward the 641st data link line. Here, the resistances R' may be slightly decreased from the 365th data link line toward the first data link line.

The resistance R' of the 229th data link line may be the same as the resistance R of the 229th data link line of the related art, and the ratio of the resistances R'/R of the 229th data link lines may be 1. The ratios of the resistances R'/R of the first to 228th data link lines are smaller than 1, and the ratios of the resistances R'/R of the 230th to 641st data link lines are larger than 1. The first to 228th data link lines of the present invention have larger resistances than the related art, and the 230th to 641st data link lines have smaller resistances than the related art.

More particularly, the ratios of the resistances R'/R of the 365th to 641st data link lines are approximately about 1.5, and the 365th to 641st data link lines of the present invention have resistances about 1.5 times larger than the related art. The resistances R' are slightly decreased from the 365th data link line toward the first data link line, and the resistances R are increased from the 365th data link line toward the first data link line. Thus, the ratios of the resistances R'/R of the 365th to first data link lines decrease. The first data link line of the present disclosure has a resistance about 0.64 times smaller than the related art.

In the present disclosure, the resistances R' of the first to 228th data link lines decrease, and the resistances R' of the 230th to 641st data line lines increase as compared with the related art. Accordingly, the resistances R' of the first to 641st data link lines are uniform.

As stated above, the second side S2 may be 4,800 micrometers. However, in the related art, to get a similar effect to the present disclosure, the second side S2 may be 6,784 micrometers. Therefore, the second side S2 of the present disclosure can be designed to be smaller than the second side S2 of the related art, and an area without displaying images, such as a bezel area, can be reduced. Thus narrow-type LCD devices can be manufactured.

Figure 8:
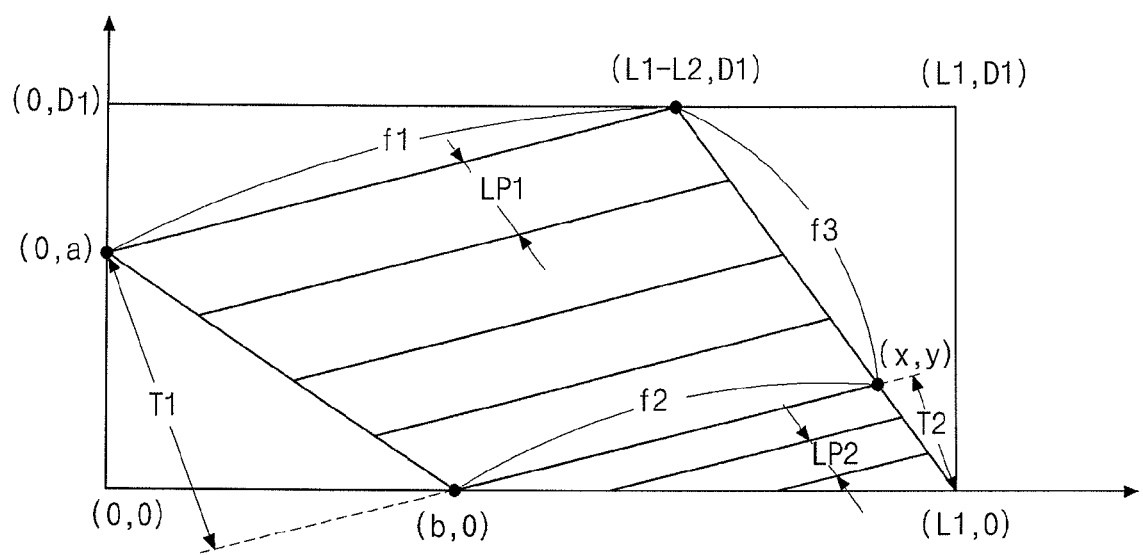
FIG. 8 is a view explaining a method of designing a link area according to the present invention.

FIG. 8 is a view of explaining a method of designing a link area according to the present disclosure. There are n (n is a nature number) data link lines in the link area, and FIG. 8 corresponds to a left half part of the link area, that is, first to (n/2)th data link lines.

In FIG. 8, a first length L1 is a distance from the first link line to the (n/2)th data link line, a second length L2 is a distance from the first data pad to the (n/2)th data pad, and a third length D1 is a length of the (n/2)th data link line. Points "a" and "b" are arbitrarily selected, and the values are disposed in an x-y coordinate plane. Then, points (0, 0), (b, 0), (L1, 0), (L1, D1), (L1-L2), (0, a), and (0, D1) are determined.

When the point (0, a) and the point (b, 0) are set, a point (x, y) can be determined at which a data link line passing through the point (b, 0) paralleled a line between (0, a) and (L1-L2, D1) meets a line connecting the point (L1-L2, D1) and the point (L1, 0). The point (x, y) is changeable by the point (0, a) and the point (b, 0). Referring to FIG. 8, when the point (0, a) and the point (b, 0) are set, a point (x, y) can be determined at which a third line f3 meets a second line f2. Wherein, the second line f2 passes through the point (b, 0) in parallel with a first line f1 connecting (0, a) and (L1-L2, D2). The third line f3 connects the point (L1-L2, D1) and the point (L1, 0). The point (x, y) is changeable by the point (0, a) and the point (b, 0).

The first, second and third lines f1, f2 and f3 are defined by the points. That is, the first line f1 is a straight line from the point (0, a) to the point (L1-L2, D1), the second line f2 is a straight line from the point (b, 0) to the point (x, y), and the third line f3 is a straight line from the point (x, y) to the point (L1-L2, D1).

An area surrounded by the points (0, a), (b, 0), (L1, 0), (x, y) and (L1-L2, D1) is divided into first and second sections. The first section is defined by the points (0, a), (b, 0), (x, y) and (L1-L2, D1), and the second section is defined by the points (b, 0), (L1, 0) and (x, y). In FIG. 8, T1 is a shortest distance from the point (0, a) to the second line f2, that is, from the first line f1 to the second line f2 parallel to the first line T2 is a shortest distance from the point (L1, 0) to the second line f2. When k (k is a natural number smaller than n/2) data link lines are disposed in the first section, a first average link pitch LP1 in the first section is defined as T1/k, that is, the distance T1 over the number of the first to kth data link lines. Additionally, (n/2-k) data link lines are disposed in the second section. Here, a second average link pitch LP2 in the second section is defined as T2/(n/2-k), that is, the distance T2 over the number of the (k+1)th to (n/2)th data link lines.

After obtaining the first average link pitch LP1 and the second average link pitch LP2, real link pitches in the first and second sections are determined. The real link pitches in the first section, that is, first link pitches, are designed to be gradually decreased toward the second line f2 from the first line f1. The real link pitches in the second section, that is, second link pitches, are equal to each other and the same as the second average link pitch LP2. In the first section, the first link pitch next to the second line f2 is designed to be the same as the second link pitches, that is, the second average link pitch LP2. Alternatively, the first link pitch next to the second line f2 is decreased. Then, the first link pitch next to the first line f1 is designed to be increased by the decrease of the first link pitch next to the second line f2 from the first average link pitch LP1. If the first link pitch next to the first line f1 is designated as LP(1), LP(1) is given by the following equation:

$$LP(1) = LP1 + (LP1 - LP2)$$
$$= 2 \times LP1 - LP2.$$

Accordingly, in the first section, other first link pitches can be calculated by an arithmetic progression or arithmetic sequence, in which the first link pitch next to the first line f1 is the initial term and the first link pitch next to the second line f2, that is, the second average link pitch LP2, is the last term. Here, the first line f1 corresponds to the first data link line, and the second line f2 corresponds to the kth data link line. That is, the first link pitches in the first section constitute an arithmetic progression with a common difference value between adjacent first link pitches.

If an xth data link line is chosen between the first to kth data link lines, the first link pitch next to the xth data link line is given by the following equation:

$$LP(x) = LP(1) - \{(LP(1) - LP2)/k\} \times x,$$

wherein $k \geq x \geq 1$

According to the equation, the first link pitches corresponding to the first to kth data link lines are gradually determined.

Figure 9A:
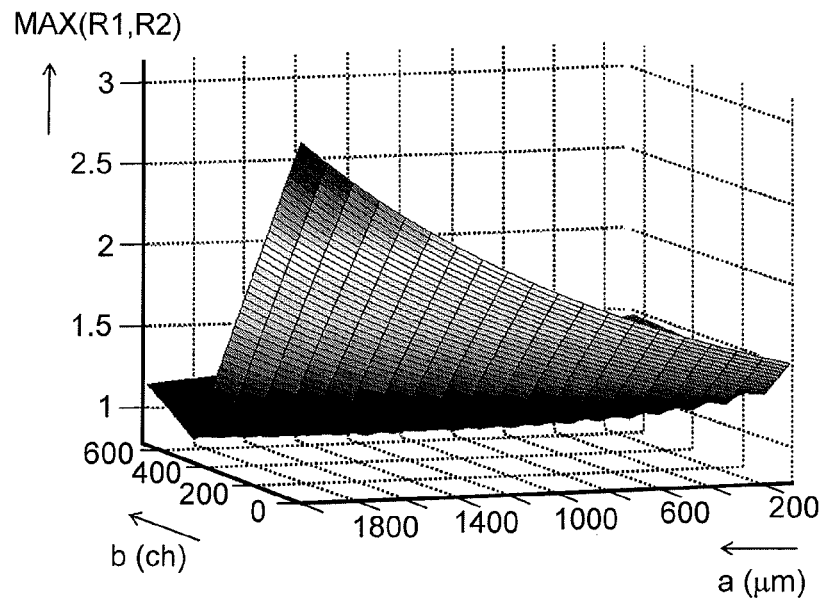
FIGS. 9A and 9B are graphs illustrating maximum resistances of data link lines according to points "a" and "b"
Figure 9B:
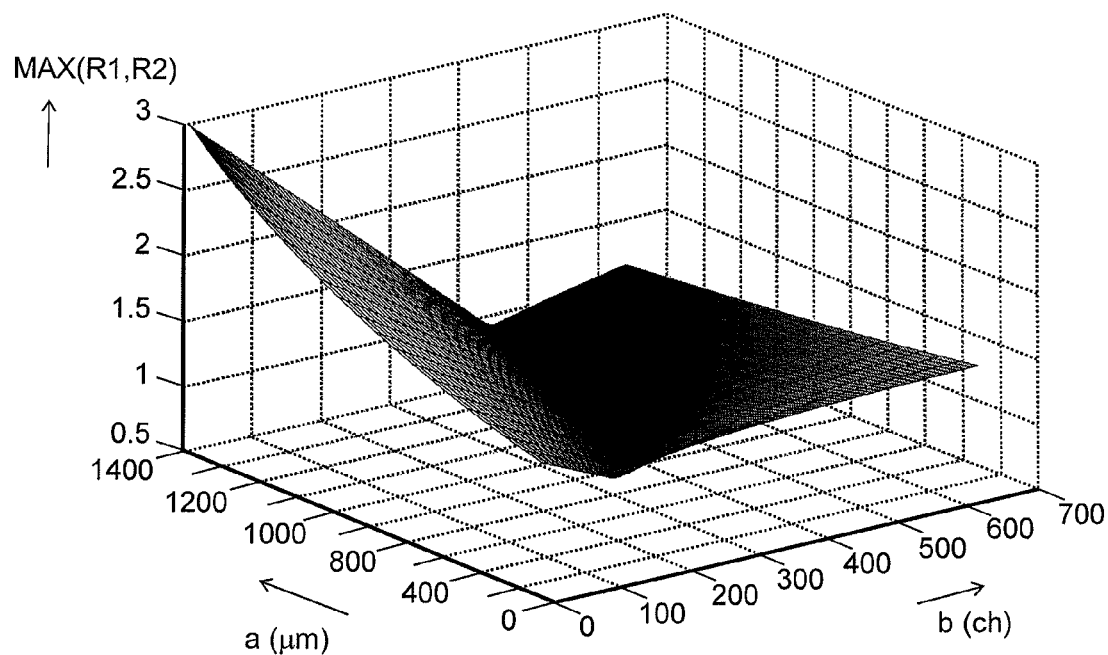

FIGS. 9A and 9B are graphs of illustrating maximum resistances of data link lines according to points "a" and "b." More particularly, a first resistance R1 in the first section and a second resistance R2 of the second section are compared, and a maximum value of the first and second resistances R1 and R2, that is, MAX(R1, R2), is selected and shown in three dimensions. The graphs of FIGS. 9A and 9B are viewed from different viewpoints.

In FIGS. 9A and 9B, the maximum values MAX(R1, R2) of the first and second resistances R1 and R2 are shown according to changes of the points "a" and "b." Here, the points "a" and "b" can be optimized in the bottom parts of the graphs where the maximum values MAX(R1, R2) of the first and second resistances R1 and R are the smallest.

The maximum values MAX(R1, R2) of the first and second resistances R1 and R decrease as the point "a" increases. That is, if the point "a" increases, there is an advantage that the resistances are lowered. However, a minimum value of the first and second link pitches may be decreased, and there is no space for the LOG (Line on Glass) line if the point "a" increases without limit. Accordingly, a value of the point "a" cannot be increased to infinity.

For example, in 1281 channels, the minimum value of the link pitches is designed as 6.5 micrometers. At this time, to satisfy the minimum value of the link pitches, the value of the point "a" is limited to 1,400 micrometers.

FIG. 10 is a table of illustrating ratios of the resistances and efficiencies according to the values of the points "a" and "b." More particularly, the ratios of the resistances are expressed as the first resistance R1 over the second resistance R2 multiplied by 100. The efficiencies mean a decreasing degree of a total resistance of the first and second resistances R1 and R2. Therefore, the larger value the point "a" has, the smaller the efficiency is.

When the point "a" has the value of 1,400 micrometers, the efficiency is the maximum. However, while the point "a" increases and the space for the LOG (Line on Glass) line decreases, the efficiency is merely increased. By considering these conditions, it is desirable that the point "a" is designed to have the value of 1,200 micrometers.

In the embodiment of the present invention, the data link lines are described, and the same concept can be applied to the gate link lines.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. An array substrate for a display device, comprising:
a substrate including a display area and a non-display area, the non-display area having a link area and a pad area;
array elements in the display area on the substrate;
first to nth pads in the pad area (n is an even number larger than 8);
first to nth link lines in the link area and connected between the first to nth pads and the array elements, respectively, wherein the first to (n/2−1)th link lines have inclined portions, a width of the inclined portion of the pth link line is wider than a width of the inclined portion of the qth link line, a length of the inclined portion of the pth link line is longer than a length of the inclined portion of the qth link line, k is a natural number larger than 2, p and q are natural numbers, and (n/2−1)≧k≧q>p≧1,
wherein link pitches of the inclined portions of the first to kth link lines decrease.

2. The array substrate according to claim 1, wherein the link pitches of the inclined portions of the first to kth link lines decrease with an arithmetic progression with a common difference value between adjacent link pitches.

3. The array substrate according to claim 1, wherein the first to (n/2)th link lines are symmetrical with the nth to (n/2+1)th link lines.

4. The array substrate according to claim 1, wherein the inclined portions of the first to kth link lines have substantially uniform resistance values.

5. The array substrate according to claim 1, wherein the inclined portions of the (k+1)th to (n/2−1)th link lines have a substantially same width.

6. The array substrate according to claim 5, wherein the inclined portions of the (k+1)th to (n/2−1)th link lines have decreasing lengths toward the (n/2−1)th link line from the (k+1)th link line.

7. The array substrate according to claim 6, wherein the inclined portions of the (k+1)th to (n/2−1)th link lines have decreasing resistance values.

8. The array substrate according to claim 5, wherein link spaces between adjacent inclined portions are substantially equal to each other.

9. The array substrate according to claim 5, wherein link pitches of the inclined portions of the (k+1)th to (n/2−1)th link lines are narrower than an average pitch of the inclined portions of the first to (n/2)th link lines.

10. The array substrate according to claim 5, wherein the second to (n/2−1)th link lines include first vertical portions connected to first ends of the inclined portions and the second to (n/2−1)th pads, respectively, and the first vertical portions of the second to (n/2−1)th link lines have a same width and increasing lengths toward (n/2−1)th link line from the second link line.

11. The array substrate according to claim 10, wherein link spaces between adjacent first vertical portions are substantially equal to each other.

12. The array substrate according to claim 10, wherein the first to (k−1)th link lines include second vertical portions connected between second ends of the inclined portions and the array elements, and the second vertical portions of the first to (k−1)th link lines have a same width and decreasing lengths toward (k−1)th link line from the first link line.

13. The array substrate according to claim 12, wherein link spaces between adjacent second vertical portions are equal to each other.

14. The array substrate according to claim 10, wherein a first line connecting the first ends of the inclined portions and a second line connecting second ends of the inclined portions are curved.

15. The array substrate according to claim 14, wherein an inclined part of the first line between the first ends of adjacent inclined portions has a larger slope than an inclined part of the second line between the second ends of the adjacent inclined portions.

* * * * *